(12) United States Patent
Neff

(10) Patent No.: US 6,259,281 B1
(45) Date of Patent: Jul. 10, 2001

(54) PARALLEL ANALOG SAMPLING CIRCUIT AND ANALOG-TO-DIGITAL CONVERTER SYSTEM INCORPORATING CLOCK SIGNAL GENERATOR GENERATING SUB-SAMPLING CLOCK SIGNALS WITH FAST AND PRECISELY-TIMED EDGES

(75) Inventor: Robert M. R. Neff, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/306,339

(22) Filed: May 6, 1999

(51) Int. Cl.$^7$ ...................................................... H03K 5/00
(52) U.S. Cl. ................................................. 327/91; 327/94
(58) Field of Search ..................................... 327/211, 212, 327/293, 295, 291, 91, 94, 95; 341/122, 172

(56) References Cited

U.S. PATENT DOCUMENTS

| | | | |
|---|---|---|---|
| 4,271,488 | * | 6/1981 | Saxe ...................................... 365/230 |
| 5,329,240 | * | 7/1994 | Kubota et al. ......................... 327/231 |
| 6,078,199 | * | 6/2000 | Kim ....................................... 327/116 |

\* cited by examiner

Primary Examiner—Tuan T. Lam
Assistant Examiner—Hiep Nguyen
(74) Attorney, Agent, or Firm—Ian Hardcastle

(57) ABSTRACT

The analog sampling circuit samples an analog input signal at intervals of time precisely defined by a master clock signal. The analog sampling circuit comprises N track-and-hold circuits and a clock signal generator. Each of the track-and-hold circuits includes a clock signal input. The clock signal generator includes a clock window signal generator and N gate circuits. The clock window signal generator comprises an input connected to receive the master clock signal, and N outputs, derives clock window signals from the master clock signal and feeds one of the clock window signals to each of the outputs. The clock window signals have imprecisely-timed edges. Each of the N gate circuits generates a sub-sampling clock signal with logic states defined by one of the clock window signals and with edge timings defined by the master clock signal independently of the imprecisely-timed edges of the clock window signal, and comprises a first input, a second input and an output. The first input is connected to one of the outputs of the clock window signal generator, the second input is connected to receive the master clock signal and the output is connected to the clock signal input of one of the track-and-hold circuits. The N-channel analog-to-digital conversion system includes the analog sampling circuit just described and an analog-to-digital converter connected to the analog output of the each of the N track-and-hold circuits.

14 Claims, 3 Drawing Sheets

PARALLEL ANALOG SAMPLING CIRCUIT AND ANALOG-TO-DIGITAL CONVERTER SYSTEM INCORPORATING CLOCK SIGNAL GENERATOR GENERATING SUB-SAMPLING CLOCK SIGNALS WITH FAST AND PRECISELY-TIMED EDGES

FIELD OF THE INVENTION

The invention relates to clock signal generators and, in particular, to clock signal generators that generate sub-sampling clock signals having fast and precisely-timed edges.

BACKGROUND OF THE INVENTION

In high-speed electronic circuits, it is often necessary to generate one or more clock signals from a master clock signal. Each clock signal typically has a lower frequency than the master clock signal, and may have an asymmetrical duty cycle. To prevent timing errors in the circuits that operate in response to such clock signals, the timing of the edges where the clock signal changes state must be precise, and the edges must be fast so that the change of state occurs in a time that is short compared with the cycle time of the master clock signal.

One example of an application in which multiple clock signals, called sub-sampling clock signals, are derived from a master clock signal and in which the sub-sampling clock signals are required to have fast, precisely-timed edges is high-speed analog-to-digital conversion. Analog-to-digital converters can be characterized, in part, by a maximum conversion frequency that defines the maximum frequency at which the converter can perform digital conversions of an analog input signal. The cost of analog-to-digital converters increases sharply with increasing conversion frequency. When an analog input signal has to be converted at a high conversion frequency, it is often more economical to replace a single, fast, expensive analog-to-digital converter with a parallel analog-to-digital conversion system composed of multiple slower, cheaper analog-to-digital converters arranged in parallel. Moreover, even if cost is not a factor, conversion frequencies higher than that of the fastest single analog-to-digital converter can only be obtained using a parallel analog-to-digital conversion system.

When an analog-to-digital conversion system composed of N parallel analog-to-digital converters is used to generate a digital representation of an analog input signal, the effective conversion frequency is N times the conversion frequency of the individual analog-to-digital converters. FIG. 1 shows an example of an analog-to-digital conversion system 10 in which N=4. The analog-to-digital conversion system 10 is composed of the analog-to-digital converters 12, 13, 14 and 15, each preceded by a respective track-and-hold circuit 16, 17, 18 and 19, and the clock signal generator 28 that generates N sub-sampling clock signals. The analog input signal received by the analog signal input 20 is fed to the signal input of each of the track-and-hold circuits. The analog signal input of the track-and-hold circuit 16 is shown at 22. The track-and-hold circuits each include a clock signal input. Each track-and-hold circuit receives a different one of the sub-sampling clock signals through its clock signal input. The clock signal input of the track-and-hold circuit 16 is shown at 23.

The clock signal generator 28 derives the N sub-sampling clock signals from a master clock signal received through the master clock signal input 29. The master clock signal runs at the conversion frequency of the analog-to-digital conversion system 10, or at a multiple of this frequency.

The track-and-hold circuits 16–19 have analog signal inputs connected to the analog input 20. For example, the analog signal input 22 of the track-and-hold circuit 16 is connected to the analog input 20. The analog outputs of the track-and-hold circuits 16–19 are connected to the analog inputs of the analog-to-digital converters 12–15, respectively. For example, the analog output 24 of the track-and-hold circuit 16 is connected to the analog input 25 of the analog-to-digital converter 12. The digital outputs of the analog-to-digital converters 12–15 are connected to the digital output bus 27. For example, the digital output 26 of the analog-to-digital converter 12 is connected to the digital output bus 27.

The track-and-hold circuits 16–19 track the analog input signal received by the analog input 20 and sequentially hold values of the analog input signal at timings determined by the sub-sampling clock signals generated by the clock signal generator 28. The analog-to-digital converters 12–15 receive the analog samples taken by the track-and-hold circuits 16–19, respectively, and generate digital representations of the analog samples. The analog-to-digital converters transfer the digital representations to the digital output bus 27 to provide a serial or parallel bitstream.

The conversion frequency of the analog-to-digital conversion system 10 is equal to the frequency of the master clock signal, but each of the analog-to-digital converters 12–15 operates at a conversion frequency equal to 1/N of the frequency of the master clock signal. Consequently, each of the analog-to-digital converters can be simpler and less expensive than a single analog-to-digital converter that has a conversion frequency equal to the frequency of the master clock signal.

FIGS. 2A–2F illustrate the operation of the analog-to-digital conversion system 10 shown in FIG. 1. FIG. 2A shows the master clock signal received by the master clock signal input 29.

FIGS. 2B–2E show the sub-sampling clock signals generated by the clock signal generator 28 and fed to the clock signal inputs of the track-and-hold circuits 16, 17, 18 and 19, respectively. The clock signal generator sequentially generates the N sub-sampling clock signals with a delay of at least one cycle of the master clock signal between them. Each of the sub-sampling clock signals clocks one of the track-and-hold circuits 16–19 at 1/N of the frequency of the master clock signal. Consequently, the sub-sampling clock signals collectively clock the track-and-hold circuits at the conversion frequency of the analog-to-digital conversion system. In the example shown, each falling edge of the master clock signal causes one of the sub-sampling clock signals to change state, and causes the sub-sampling clock signal that changed state in response to the previous falling edge to revert to its original state. The changes in state of the sub-sampling clock signals are each delayed relative to the falling edges of the master clock signal by the propagation delay $t_d$ of the clock signal generator.

FIG. 2F shows the exemplary analog input signal 30 that is subject to conversion by the analog-to-digital conversion system 10. In this example, the analog input signal is a slow linear ramp to simplify the explanation, and the track-and-hold circuits 16–19 hold the level of the analog input signal when the rising edge of the respective sub-sampling clock signal reaches a level half-way between its low and high states. The sub-sampling clock signals shown in FIGS. 2B–2E are "ideal" sub-sampling clock signals in that they all have fast edges, and they all change state at timings having a fixed relationship to the master clock signal. As a result, consecutive analog samples 31, 32, 33 and 34 of the analog input signal 30 captured by the track-and-hold circuits 16–19, respectively, are at equal increments on the voltage scale V shown in FIG. 2F. The analog samples are then converted to digital representations by the analog-to-digital converters 12–15, respectively.

In practical embodiments of the analog-to-digital conversion system 10, a ring counter is conventionally employed as the clock signal generator 28. Ring counters are known in the art, and will therefore not be described in detail here. To generate N sub-sampling clock signals, a ring counter circuit composed of N counting stages is used. Although ring counters are capable of generating all of the sub-sampling clock signals with fast edges, this can only be achieved at the expense of high power consumption. Thus, in practical clock generator circuits employing a ring counter, at least some of the sub-sampling clock signals have slow edges. Moreover, the paths between the outputs of the counting stages and the track-and-hold circuits differ in length, and not all of the counting stages drive the same load. These factors impair the precision of the timing of the sub-sampling clock signals relative to the master clock signal.

FIGS. 2G–2I illustrate the effect of sub-sampling clock signals with slow edges and imprecise timing on the conversion accuracy of the analog-to-digital conversion system 10. In FIG. 2G, the edges of the sub-sampling clock signal fed to the track-and-hold circuit 19 change more slowly than the edges of the "ideal" sub-sampling clock signal shown in FIG. 2E. The edges of the "ideal" sub-sampling clock signal are indicated in FIG. 2G by broken lines. The slower edges of the sub-sampling clock signal cause the track-and-hold circuit 19 to hold the analog input signal 30 later than if it were clocked by the "ideal" sub-sampling clock signal shown in FIG. 2E. As a result, as shown in FIG. 2I, the level of the analog sample 35 on the voltage scale V is different from than that of the analog sample 34. A conversion error can result when the analog-to-digital converter 15 converts this analog sample into a digital representation.

It should be mentioned that, in the example shown in FIG. 2G, the voltage level on the clock signal input required to switch the track-and-hold circuit 19 to its hold state is independent of the level of the analog input signal 30 to simplify the explanation. In many practical track-and-hold circuits, the voltage level on the clock signal input required to switch the track-and-hold circuit to its hold state depends on the level of the analog input signal. This effect may increase or decrease the sampling errors shown in FIG. 2I. Whether the sampling error is increased or decreased depends on whether the analog input signal is changing in the same direction as, or the opposite direction to, the direction of the edge of the sub-sampling clock signal that switches the track-and-hold circuit to its hold state. When the analog input signal is a sine-wave, for example, this effect introduces harmonic distortion when the digital representations are converted back to an analog signal.

In FIG. 2H, the edges of the sub-sampling clock signal fed to the track-and-hold circuit 16 are delayed relative to the "ideal" sub-sampling clock signal shown in FIG. 2B. The edges of the "ideal" sub-sampling clock signal are indicated in FIG. 2H by broken lines. The delayed sub-sampling clock signal causes the track-and-hold circuit 16 to hold the analog input signal 30 later than if it were clocked by the "ideal" sub-sampling clock signal shown in FIG. 2B. As a result, as shown in FIG. 2I, the level of the analog sample 36 on the voltage scale V is greater than that of the analog sample 31. A conversion error can result when the analog-to-digital converter 12 converts this analog sample into a digital representation.

Thus, the conversion accuracy of an analog-to-digital conversion system composed of parallel analog-to-digital converters each preceded by a track-and-hold circuit depends on the speed and timing precision of the edges of the sub-sampling clock signals fed to the track-and-hold circuits. If the edges of the sub-sampling clock signal have imprecise timing or are slow, the analog input signal will be sampled at a time different from the time defined by the master clock signal. At the time defined by the edge of the sub-sampling clock signal, the value of the analog input signal will be different from its value at the time defined by the master clock signal, and an error in the analog sample will result. Errors in the analog samples cause conversion errors when the analog-to-digital converters convert the analog samples to digital representations.

Thus, what is needed in an analog-to-digital conversion system composed of N parallel analog-to-digital converters each preceded by a track-and-hold circuit is a clock signal generator capable of generating N sub-sampling clock signals whose edges are all substantially as fast as those of the master clock signal and that are precisely timed in relation to the edges of the master clock signal.

What is also needed in an analog sampling system composed of N parallel track-and-hold circuits is a clock signal generator capable of generating N sub-sampling clock signals whose edges are all substantially as fast as those of the master clock signal and that are precisely timed in relation to the edges of the master clock signal.

Finally, what is needed is a clock signal generator capable of generating N sub-sampling clock signals whose edges are all substantially as fast as those of the master clock signal and that are precisely timed in relation to the edges of the master clock signal.

SUMMARY OF THE INVENTION

The invention provides an analog sampling circuit for sampling an analog input signal at intervals of time precisely defined by a master clock signal. The analog sampling circuit comprises N track-and-hold circuits and a clock signal generator. Each of the track-and-hold circuits includes a clock signal input. The clock signal generator includes a clock window signal generator and N gate circuits. The clock window signal generator comprises an input connected to receive the master clock signal, and N outputs, derives clock window signals from the master clock signal and feeds one of the clock window signals to each of the outputs. The clock window signals have imprecisely-timed edges. Each of the N gate circuits generates a sub-sampling clock signal with logic states defined by one of the clock window signals and with edge timings defined by the master clock signal independently of the imprecisely-timed edges of the clock window signal, and comprises a first input, a second input and an output. The first input is connected to one of the outputs of the clock window signal generator, the second input is connected to receive the master clock signal and the output is connected to the clock signal input of one of the track-and-hold circuits.

The invention also provides an N-channel parallel analog-to-digital conversion system. The system comprises N track-and-hold circuits, N analog-to-digital converters, and a clock signal generator. Each of the track-and-hold circuits includes a clock signal input, an analog signal input and an analog output. The analog signal inputs of all the track-and-hold circuits are connected to one another. Each of the analog-to-digital converters includes a digital output and an analog input. The analog input is connected to the analog output of one of the track-and-hold circuits. The clock signal generator, includes a clock window signal generator and N gate circuits. The clock window signal generator comprises an input connected to receive a master clock signal, and N outputs, derives clock window signals from the master clock signal, and feeds one of the clock window signals to each of the outputs. The clock window signals each have imprecisely-timed edges. Each of the N gate circuits generates a sub-sampling clock signal with logic states defined by one of the clock window signals and with edge timings defined by the master clock signal independently of the imprecisely-timed edges of the clock window signal, and comprises a first input, a second input and an output. The first input is connected to one of the outputs of the clock window signal generator, the second input is connected to receive the master clock signal, and the output is connected to the clock signal input of one of the track-and-hold circuits.

DETAILED DESCRIPTION OF THE INVENTION

Figure 1:
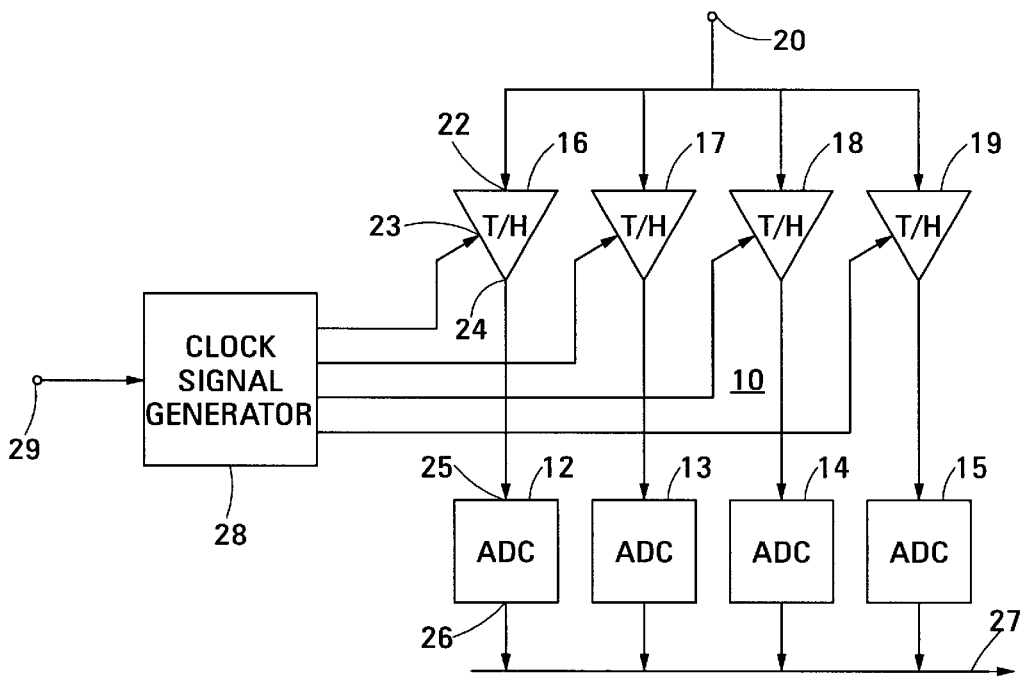
FIG. 1 is a block diagram of a conventional parallel analog-to-digital conversion system.
Figure 3:
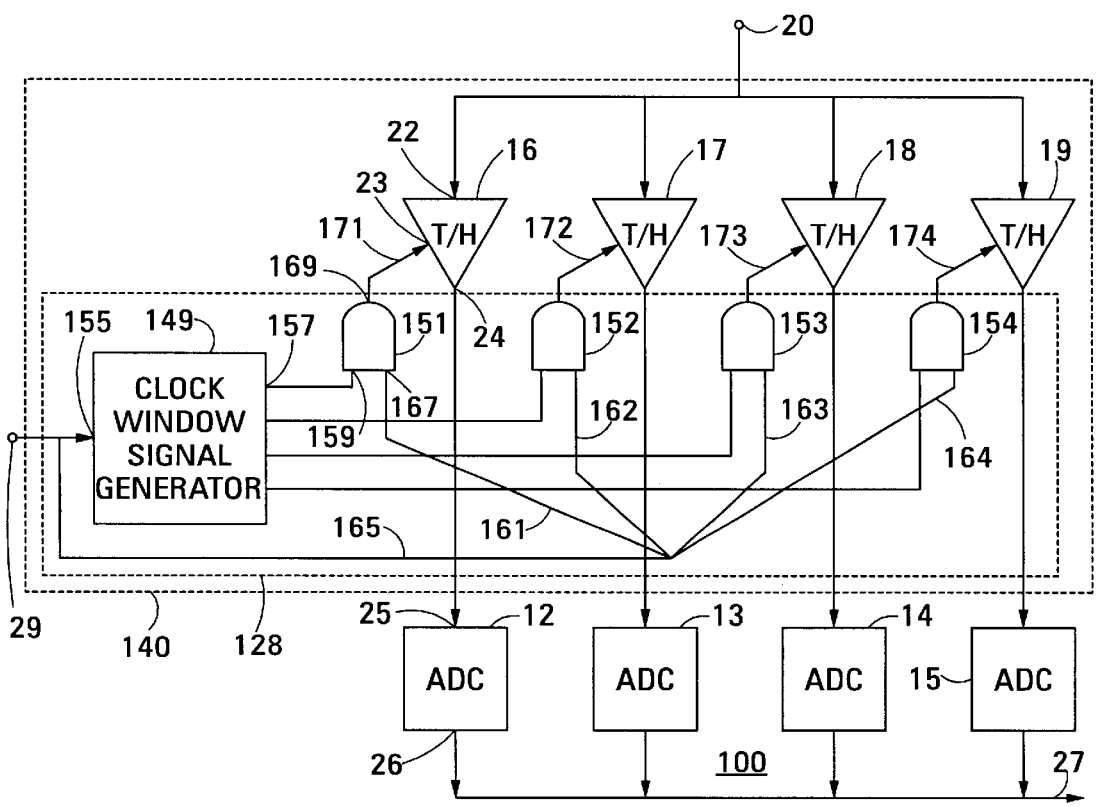
FIG. 3 is a block diagram of an analog-to-digital conversion system according to the invention that incorporates an analog sampling system according to the invention and a clock signal generator according to the invention.

FIG. 3 shows an embodiment 100 of an analog-to-digital conversion system according to the invention incorporating the analog sampling system 140 and the clock signal generator 128 according to the invention. In the embodiment shown, the analog-to-digital conversion system includes the four analog-to-digital converters and four track-and-hold circuits, and the clock signal generator generates four sub-sampling clock signals, i.e., N=4 in this example. Elements of the embodiment shown in FIG. 3 that correspond to elements of the analog-to-digital conversion system shown in FIG. 1 are indicated by the same reference numerals and will not be described in detail here.

The clock signal generator 128 is composed of the N-output clock window signal generator 149 and the N gate circuits 151, 152, 153 and 154. In the example shown, the gate circuits are two-input AND gates. The clock window signal generator includes a clock signal input 155 and N outputs, one for each of the sub-sampling clock signals generated by the clock signal generator. The clock signal input is connected to receive the master clock signal from the master clock signal input 29. The clock window signal generator has N outputs, an exemplary one of which is shown at 157, and provides a different clock window signal on each of the outputs.

A ring counter, for example, may be used as the clock window signal generator 149. The ring counter can have a significantly lower power consumption than that of ring counter used as the clock signal generator 28 in the example shown in FIG. 1 because there is no requirement for the clock window signals to have fast edges with precisely-defined timing. Other circuits capable of generating clock window signals from a master clock signal, and that suffer from such defects as imprecise edge timing and slow and inconsistent edge speeds, are known and can be used as the clock window signal generator.

Each of the N gate circuits 151–154 is a two-input AND gate in the example shown. Low-power AND gates suitable for use as the gate circuits 151–154 are known in the art. Such gates generate fast edges, have a predictable and consistent propagation delay and are easy to fabricate using common semiconductor fabrication processes such as CMOS. Each of the gate circuits has a first input, a second input and an output. The first input of each of the gate circuits is connected to a different one of the outputs of the clock window signal generator 149, so that the first inputs of the gate circuits all receive a different one of the N clock window signals generated by the clock window signal generator. For example, the first input 159 of the gate circuit 151 is connected to the output 157 of the clock window signal generator.

The second inputs of the gate circuits 151–154 are connected to receive the master clock signal from the master clock signal input 29. For example, the conductors 161 and 165 connect the second input 167 of the gate circuit 151 to the master clock signal input.

The outputs of the gate circuits 151–154 are connected to the clock signal inputs of the track-and-hold circuits 16–19, respectively, so that the sub-sampling clock signals generated by the gate circuits 151–154 are fed to the clock signal inputs of the track-and-hold circuits 16–19, respectively. For example, the conductor 171 connects the output 169 of the gate circuit 151 to the clock signal input 23 of the track-and-hold circuit 16.

The clock signal generator 128 just described generates N sub-sampling clock signals all with fast, precisely-timed edges. The sub-sampling clock signals are generated by the gate circuits 151–154. The low-power AND gates used as the gate circuits 151–154 generate fast edges and have a predictable and consistent propagation delay. Additionally, the outputs of the gate circuits 151–154 are connected exclusively to the respective clock signal inputs of the track-and-hold circuits 16–19 so that the loads applied to the outputs of the gates are closely matched. Consequently, the edges of the sub-sampling clock signals generated by the gates 151–154 have timings defined primarily by the edges of the master clock signal and speeds that are fast and closely matched.

The timing accuracy of the edges of the sub-sampling clock signals generated by the gates 151–154 is further increased by making the conductors 161–164 through which the master clock signal is delivered to the second inputs of the gate circuits 151–154, respectively, all equal in length and by making the conductors 171–174 through which the sub-sampling clock signals are delivered from the outputs of the gate circuits 151–154 to the track-and-hold circuits 16–19, respectively, also all equal in length. The conductors 161–164 being equal in length and the conductors 171–174 being equal in length eliminate parallel path length differences that would otherwise change the timing relationships among the sub-sampling clock signals delivered by the clock generator circuit 128 to the track-and-hold circuits 16–19. If layout considerations prevent the conductors from being exactly equal in length, the conductors should be as close to equal in length as possible.

Figure 4A:
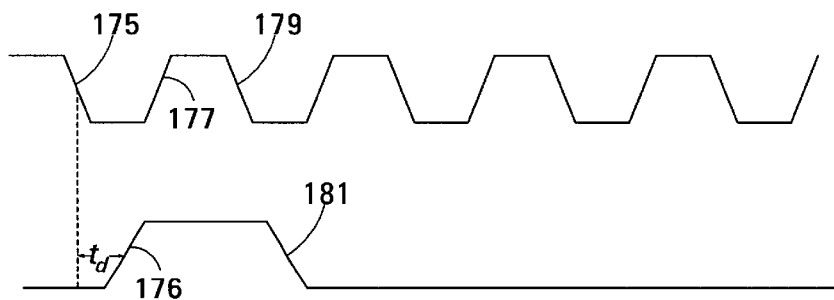
FIGS. 4A–4J illustrate the operation of the analog sampling system and the analog-to-digital conversion system shown in FIG. 3 and show how the fast, precisely-timed edges of the sub-sampling clock signals generated by the clock signal generator according to the invention prevent sampling errors.

The operation of the analog-to-digital conversion system 100 will now be described with reference to FIGS. 3 and 4A–4J. FIG. 4A shows the master clock signal received by the master clock signal input 29.

FIGS. 4B, 4D, 4F and 4H show the clock window signals generated by the clock window signal generator 149 and fed to the first inputs of the gate circuits 151–154, e.g., to the first input 159. The clock window signal generator sequentially generates the clock window signals with a delay of at least one cycle of the master clock signal between them. In the example shown, each falling edge of the master clock signal causes one of the clock window signals to change state, and causes the clock window signal that changed state in response to the previous falling edge to revert to its original state. Consequently, in the example shown, each of the N clock window signals is in its 1 state during a different cycle of the master clock signal, and is its 0 state for the remaining N−1 cycles of the master clock signal. The changes in state of the clock window signals are delayed relative to the falling edges of the master clock signal by the propagation delay $t_d$ of the clock window signal generator 149.

As noted above, the propagation delay of the clock window signal generator 149 may be different for each of its N outputs, e.g., the output 157 may have a propagation delay that differs from that of the other outputs. Moreover, the edges of the clock window signals may be substantially slower than those of the master clock signal, and the speed of the edges of the clock window signals may be different for each of the N outputs. Thus, each of the gate circuits 151–154 may receive a clock window signal whose edges differ in timing and in speed in a manner similar to the way in which edges of the sub-sampling clock signals received by the track-and-hold circuits 16–19 differed in timing and in speed in the conventional embodiment shown in FIG. 1.

FIGS. 4C, 4E, 4G and 4I show the sub-sampling clock signals generated by the gate circuits 151–154, respectively, and fed to the track-and-hold circuits 16–19, respectively. The gate circuits generate the sub-sampling clock signals in response to the clock window signals generated by the clock window signal generator and the master clock signal. The gate circuits sequentially generate the sub-sampling clock signals with a delay of at least one cycle of the master clock signal between them. The delay is one cycle in the example shown. Each of the sub-sampling clock signals clocks one of the track-and-hold circuits 16–19 at 1/N of the frequency of the master clock signal. Consequently, the sub-sampling clock signals collectively clock the track-and-hold circuits 16–19 at the conversion frequency of the analog-to-digital conversion system 100.

Figure 4B:
Figure 4C:

FIGS. 4A–4C illustrate the operation of the gate circuit 151. The operation of the gate circuits 152–154 is similar and will not be described. FIG. 4B shows the clock window signal generated by the output 157 of the clock window signal generator 149 and fed to the first input 159 of the gate circuit 151. The clock window signal changes from its 0 state to its 1 state, as shown at 176 in FIG. 4B, in response to the falling edge 175 of the master clock signal shown In FIG. 4A The change in state of the clock window signal is delayed relative to the falling edge 175 by the propagation delay $t_d$ of the stage of the clock window signal generator 149 that generates the clock window signal.

The gate circuit 151 is an AND gate. When the clock window signal on its first input 159 changes state, the 0 state of the master clock signal on its second input 167 holds Its output 169 in the 0 state. Before the clock window signal changes state again, the master clock signal on the second input 167 of the gate circuit changes to its 1 state, as indicated at 177. After the propagation delay of the gate circuit, the output 169 changes to its 1 state, as shown at 178 in FIG. 4C. Before the clock window signal shown in FIG. 4B changes state again, the master clock signal on the second input 167 reverts to its 0 state, as indicated at 179. After the propagation delay of the gate circuit, the output 169 reverts to its 0state, as indicated at 180. Finally, the clock window signal shown in FIG. 4B reverts to its 0 state, as shown at 181. As noted above, the timing and speed of the edge 181 of the clock window signal is uncertain. However, the change of state of the clock window signal does not change the state of the output 169 of the gate circuit, so the speed and timing uncertainty of the edge 181 do not impose speed and timing uncertainty on the sub–sampling clock signal generated by the gate circuit 151. Subsequent changes of the state of the master clock signal on the second input 167 of the gate circuit do not change the state of the output 169 until the clock window signal on the first input 159 once more returns to its 1 state.

The edges of the master clock signal received by the input 159 of the gate circuit 151 are fast and are precisely timed. The output 169 of the gate circuit changes state in response to the master clock signal changing state only during the time that the clock window signal is in its 1 state. Accordingly, regardless of the timing and speed of the edges 176 and 181 of the clock window signal generated by the clock window signal generator 149, the timing of the edges 178 and 180 of the sub-sampling clock signal depends only on the timing and speed of the edges 177 and 179 of the master clock signal and the propagation delay of the gate circuit. Moreover, the low-power AND gates used as the gate circuits 151–154 generate fast edges and have a predictable and consistent propagation delay. Thus, the edges, such as the edges 178 and 180, of the sub-samplings clock signal are fast, and the predictable and consistent propagation delay of the the gates matches the propagation delays of the gate circuits 151–154. Consequently, the clock signal generator 128 according to the invention generates sub-sampling clock signals with edges that are faster and are more precisely timed than those of the sub-sampling clock signals generated by the conventional clock signal generator 28 shown in FIG. 1.

The clock signal generator 128 according to the invention enables the analog-to-digital conversion system 100 according to the invention to take consecutive samples of the analog input signal at times that are precisely defined by the master clock signal. The conversion accuracy of the analog-to-digital conversion system can therefore be high. FIG. 4J shows the exemplary analog input signal 30 that is subject to conversion by the analog-to-digital conversion system 100. In this example, the analog input signal is a slow linear ramp to simplify the explanation, and the track-and-hold circuits 16–19 sample the analog input signal when the rising edge of the respective sub-sampling clock signal reaches a level half-way between its low and high states. The sub-sampling clock signals shown in FIGS. 4C, 4E, 4G and 4I fed to the track-and-hold circuits 16–19, respectively, closely approximate "ideal" sub-sampling clock signals in that their edges are fast and have a precise timing relationship to the master clock signal. As a result, consecutive analog samples 31, 32, 33 and 34 of the linear ramp signal

30 captured by the track-and-hold circuits 16–19, respectively, in response to the sub-sampling clock signal generated by the clock signal generator 128 according to the invention are at equal increments on the voltage scale V shown in FIG. 4J. The analog samples are then converted to digital representations by the analog-to-digital converters 12–15, respectively.

Figure 2A:
FIGS. 2A–2F Illustrate the operation of the conventional analog-to-digital conversion system shown in FIG. 1 with "ideal" sub-sampling clock signals.
Figure 2B:
Figure 2C:
Figure 2D:
Figure 2E:
Figure 2F:
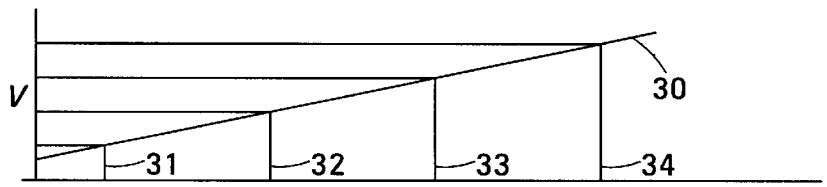
Figure 2G:
FIGS. 2G–2I show the sampling errors caused by the sub-sampling clock signals having slow and imprecisely-timed edges in the conventional analog-to-digital conversion system shown in FIG. 1.
Figure 2H:
Figure 2I:
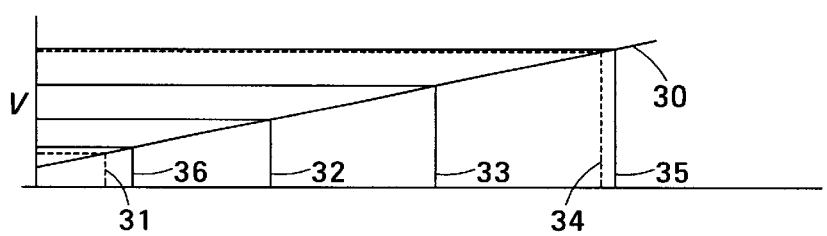
Figure 4D:
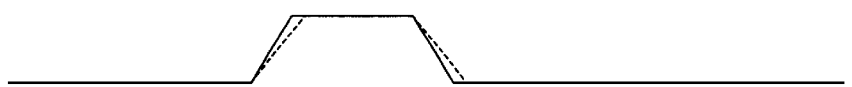
Figure 4E:
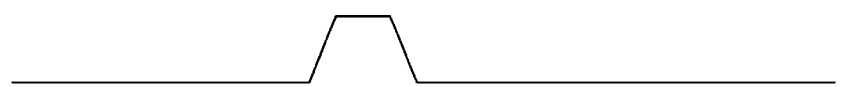
Figure 4F:
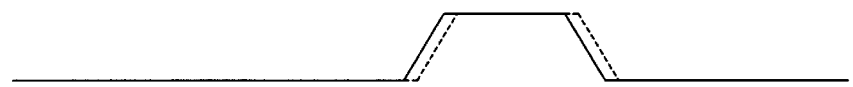
Figure 4G:
Figure 4H:
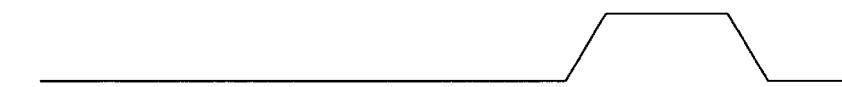
Figure 4I:
Figure 4J:
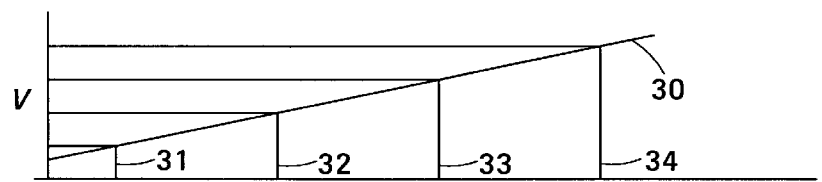

Shown by broken lines in FIG. 4D is an example of a clock window signal with slow edges similar to the sub-sampling clock signal with slow edges shown in FIG. 2G. Shown by broken lines in FIG. 4F is an example of a clock window signal generated by a stage of the clock window signal generator that has a long propagation delay. This clock window signal is similar to the sub-sampling clock signal with a long propagation delay shown in FIG. 2H. It can be seen that neither of the illustrated characteristics of the edges of the clock window signal changes the sub-sampling clock signals shown in FIGS. 4E and 4G, respectively. The characteristics of the edges of the clock window signals do not change the corresponding sub-sampling clock signals provided that, in the example shown, each clock window signal reaches a level corresponding to the logical 1 input level of the gate circuits 151–154 before the master clock signal changes state. Thus, common defects in the clock window signals do not degrade the conversion accuracy of the analog-to-digital conversion system 100.

Although the clock signal generator, analog sampling circuit and analog-to-digital conversion system according to the invention have been described with reference to examples in which the gate circuits 151–154 are two-input AND gates, this is not critical to the invention. Two-input OR gates, two-input NAND gates, or two-input NOR gates may be used as the gate circuits 151–154. Moreover, gates having more than two inputs may be used as the gate circuits 151–154 provided that the unused inputs of the gates are connected to the inputs that are used or are connected to an appropriate fixed level.

Although the clock signal generator, analog sampling circuit and analog-to-digital conversion system according to the invention have been described with reference to examples in which the clock window signal generator operates in response to falling edges of the master clock signal and in which the track-and-hold circuits are set to their hold mode by the rising edges of the sub-sampling clock signals, these details are not critical to the invention. It will be apparent to a person of ordinary skill in the art that the senses and logic states of the elements of the example shown can be inverted within the scope of the invention.

Although the clock signal generator, analog sampling circuit and analog-to-digital conversion system according to the invention have been described with reference to examples in which N=4, this is not critical to the invention. N can be any integer greater than unity.

Although the analog sampling circuit and analog-to-digital conversion system according to the invention have been described with reference to examples that include track-and-hold circuits that operate in response to the sub-sampling clock signals generated by the clock signal generator according to the invention, this is not critical to the invention. The analog sampling circuit and the analog-to-digital conversion system according to the invention may alternatively include sample-and-hold circuits that operate response to the sub-sampling clock signals generated by the clock signal generator according to the invention. Accordingly, as used in this disclosure, the term track-and-hold will be taken to encompass the term sample-and-hold.

Although the analog-to-digital conversion system according to the invention has been described with reference to an example in which each analog-to-digital converter is preceded by a separate track-and-hold circuit that operates in response to one of the sub-sampling clock signals generated by the clock signal generator according to the invention, this is not critical to the invention. Each track-and-hold circuit that operates in response to one of the sub-sampling clock signals generated by the clock signal generator according to the invention may constitute part of the circuitry of one of the analog-to-digital converters.

Although this disclosure describes illustrative embodiments of the invention in detail, it is to be understood that the invention is not limited to the precise embodiments described, and that various modifications may be practiced within the scope of the invention defined by the appended claims.

I claim:

1. An analog sampling circuit for sampling an analog input signal at intervals of time precisely defined by a master clock signal, the analog sampling circuit comprising:
   N track-and-hold circuits each including a clock signal input, where N is an integer greater than unity; and
   a clock signal generator, including:
      a clock window signal generator, comprising:
         an input connected to receive the master clock signal, and
         N outputs,
      the clock window signal generator deriving clock window signals from the master clock signal and feeding one of the clock window signals to each of the outputs, the clock window signals having imprecisely-timed edges,
      N gate circuits, each generating a sub-sampling clock signal with logic states defined by one of the clock window signals and with edge timings defined by the master clock signal independently of the imprecisely-timed edges of the one of the clock window signals, and comprising:
         a first input connected to one of the outputs of the clock window signal generator;
         a second input connected to receive the master clock signal; and
         an output connected to the clock signal input of one of the track-and-hold circuits.

2. The analog sampling circuit of claim 1, in which:
   the edges of the clock window signals have rates of change with time; and
   the gate circuits generate the sub-sampling clock signal with edges having rates of change with time independent of the rates of change with time of the edges of the clock window signals.

3. The analog sampling circuit of claim 1, iii which the gate circuits have matched propagation delays.

4. The analog sampling circuit of claim 1, in which the outputs of the gate circuits drive substantially equal loads.

5. The analog sampling circuit of claim 1, additionally comprising signal paths of substantially equal length through which the second inputs of the gate circuits are connected to receive the master clock signal.

6. The analog sampling circuit of claim 1, additionally comprising signal paths of substantially equal length interconnecting the outputs of the gate circuits to the clock signal inputs of the track-and-hold circuits.

7. An N-channel parallel analog-to-digital conversion system, comprising:
   N track-and-hold circuits each including an analog signal input, a clock signal input and an analog output, the analog signal inputs of the track-and-hold circuits being connected to one another, where N is an integer greater than unity;

N analog-to-digital converters, each including an analog input and a digital output, the analog input being connected to the analog output of one of the track-and-hold circuits; and a clock signal generator, including:
a clock window signal generator comprising an input connected to receive a master clock signal, and N outputs, the clock window signal generator deriving clock window signals from the master clock signal and feeding one of the clock window signals to each of the outputs, the clock window signals each having imprecisely-timed edges, N gate circuits, each generating a sub-sampling clock signal with logic states defined by one of the clock window signals and with edge timings defined by the master clock signal independently of the imprecisely-timed edges of the one of the clock window signals, and comprising:
a first input connected to one of the outputs of the clock window signal generator;
a second input connected to receive the master clock signal; and
an output connected to the clock signal input of one of the track-and-hold circuits.

8. The analog-to-digital conversion system of claim 7, in which:
the edges of the clock window signals have rates of change with time; and
the gate circuits generate the sub-sampling clock signals with edges having rates of change with time independent of the rates of change with time of the edges of the clock window signals.

9. The analog-to-digital conversion system of claim 7, in which the gate circuits have matched propagation delays.

10. The analog sampling circuit of claim 7, in which the outputs of the gate circuits drive substantially equal loads.

11. The analog-to-digital conversion system of claim 7, additionally comprising signal paths of substantially equal length through which the second inputs of the gate circuits are connected to receive the master clock signal.

12. The analog-to-digital conversion system of claim 7, additionally comprising signal paths of substantially equal length interconnecting the outputs of the gate circuits to the clock signal inputs of the track-and-hold circuits.

13. The clock signal generator of claim 1, in which the gates each include one of an AND gate, an OR gate, a NAND gate and a NOR gate.

14. The clock signal generator of claim 7, in which the gates each include one of an AND gate, an OR gate, a NAND gate and a NOR gate.

* * * * *